United States Patent
Yang et al.

(10) Patent No.: US 11,462,513 B2
(45) Date of Patent: Oct. 4, 2022

(54) CHIP BONDING ALIGNMENT STRUCTURE, CHIP BONDING STRUCTURE AND METHODS FOR FABRICATING THE SAME

(71) Applicant: UNITED MICROELECTRONICS CORP., Hsinchu (TW)

(72) Inventors: Chin-Chia Yang, Tainan (TW); Fu-Yu Tsai, Tainan (TW); Da-Jun Lin, Kaohsiung (TW); Bin-Siang Tsai, Changhua County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 17/180,909

(22) Filed: Feb. 22, 2021

(65) Prior Publication Data
US 2022/0208727 A1    Jun. 30, 2022

(30) Foreign Application Priority Data
Dec. 29, 2020    (CN) .......................... 202011589292.9

(51) Int. Cl.
| | |
|---|---|
| *H01L 25/065* | (2006.01) |
| *H01L 23/00* | (2006.01) |
| *H01L 23/544* | (2006.01) |
| *H01L 21/768* | (2006.01) |
| *H01L 25/00* | (2006.01) |

(52) U.S. Cl.
CPC .... *H01L 25/0657* (2013.01); *H01L 21/76898* (2013.01); *H01L 23/544* (2013.01); *H01L 24/08* (2013.01); *H01L 24/80* (2013.01); *H01L 25/50* (2013.01); *H01L 2223/54426* (2013.01); *H01L 2224/0217* (2013.01); *H01L 2224/08146* (2013.01); *H01L 2224/8013* (2013.01); *H01L 2224/80896* (2013.01); *H01L 2225/06541* (2013.01); *H01L 2225/06593* (2013.01)

(58) Field of Classification Search
CPC .......... H01L 25/0657; H01L 21/76898; H01L 23/544; H01L 24/08; H01L 24/80; H01L 25/50; H01L 2223/54426; H01L 2224/0217; H01L 2224/08146; H01L 2224/8013; H01L 2224/80896; H01L 2225/06541; H01L 2225/06593
See application file for complete search history.

(56) References Cited

U.S. PATENT DOCUMENTS 8,030,737 B2    10/2011    Oshida et al.
2003/0209738 A1*    11/2003    Ohto ................. H01L 21/76808
                                                    257/E21.585

(Continued)

*Primary Examiner* — Thanh Y. Tran
(74) *Attorney, Agent, or Firm* — WPAT, PC (57) ABSTRACT

A chip bonding alignment structure includes a semiconductor chip, a metal layer, an etching stop layer, at least one metal bump, a dielectric barrier layer, a silicon oxide layer, and a silicon carbonitride layer. The metal layer is disposed on a bonding surface of the semiconductor chip and has a metal alignment pattern. The etching stop layer covers the bonding surface and the metal layer. The metal bump extends upward from the metal layer and penetrates through the etching stop layer. The dielectric barrier layer covers the etching stop layer and the metal bump. The silicon oxide layer covers the dielectric barrier layer. The silicon carbonitride layer covers the silicon oxide layer.

10 Claims, 5 Drawing Sheets

(56) References Cited

U.S. PATENT DOCUMENTS

2009/0032941 A1* 2/2009 McLellan ............... H01L 23/50
257/737
2010/0001399 A1* 1/2010 Topacio ................. H01L 24/03
257/E21.511

* cited by examiner

CHIP BONDING ALIGNMENT STRUCTURE, CHIP BONDING STRUCTURE AND METHODS FOR FABRICATING THE SAME

This application claims the benefit of People's Republic of China application Serial No. 202011589292.9, filed Dec. 29, 2020, the subject matter of which is incorporated herein by reference.

BACKGROUND

Technical Field

The disclosure relates in generally to a semiconductor device and a fabricating method thereof, and more particularly to a bonding alignment structure of a semiconductor chip, a bonding chip structure manufactured by using the bonding alignment structure and method for fabricating the same.

Description of the Related Art

Chip bonding technology refers to the bonding of two semiconductor chips (eg, wafers), in which a chemical bond connection can be formed between these two by subjecting a high temperature annealing treatment after cleaning. It has become an important means for preparing composite materials and realizing micro-machining, and is widely used in semiconductor manufacturing process applications, including substrate engineering, integrated circuit manufacturing, micro-electro-mechanical systems (MEMS), and packaging technologies.

A typical chip bonding technology, an inter-bonding layer (IBL) including a dielectric buffer layer and a bonding material layer (usually a silicon carbonitride layer) may be firstly formed on the bonding surfaces of two semiconductor chips used to be bonded. The surface atoms of the bonding material layers of these two semiconductor chips may be triggered to form covalently bonds by heat and pressure. When the bonding energy reaches a certain strength, these two can be bonded without using a bonding medium. In order to accurately align the two semiconductor chips, an alignment mark is generally formed on the bonding metal layer closest to its bonding surface in one of the semiconductor chips; and an image recognition can be used to identify the alignment mark during the chip bonding process. Therefore, these two semiconductor chips can be precisely bonded face to face.

However, because the alignment mark is covered by the dielectric buffer layer and the bonding material layer, that may make the alignment mark unclear and poorly recognized, thereby the alignment accuracy of bonding the two semiconductor chips may be reduced. In addition, the alignment mark is usually configured as a copper metal pattern, and before these two chips are bonded together, copper bump defects (Cu hillock) may be formed due to the fact that the copper metal pattern may be subjected to other thermal manufacturing processes (such as thermal annealing process). The dielectric buffer layer and/or bonding material layer thus may be penetrated, so as to cause copper ions diffusing into the dielectric buffer layer and/or bonding material layer or other subsequent material layers, which may affect the performance and reliability of the bonding semiconductor chips.

Therefore, there is a need of providing a chip bonding alignment structure, a bonding chip structure and method for fabricating the same to obviate the drawbacks encountered from the prior art.

SUMMARY

One aspect of the present disclosure is to provide a chip bonding alignment structure, wherein the chip bonding alignment structure includes a semiconductor chip, a metal layer, an etching stop layer, at least one metal bump, a dielectric barrier layer, a silicon oxide layer, and a silicon carbonitride layer. The metal layer is disposed on a bonding surface of the semiconductor chip and has a metal alignment pattern. The etching stop layer covers the bonding surface and the metal layer. The metal bump extends upward from the metal layer and penetrates through the etching stop layer. The dielectric barrier layer covers the etching stop layer and the metal bump. The silicon oxide layer covers the dielectric barrier layer. The silicon carbonitride layer covers the silicon oxide layer.

Another aspect of the present disclosure is to provide a method for fabricating a chip bonding alignment structure, wherein the method includes steps as follows: Firstly, a metal layer is formed on a bonding surface of a semiconductor chip to make the metal layer having a metal alignment pattern. An etching stop layer is then formed to cover the bonding surface and the metal layer; and a high pressure annealing (HPA) process is performed to form at least one metal bump, which extends upward from the metal layer and penetrates through the etching stop layer. Next, a dielectric barrier layer is formed to cover the etching stop layer and the metal bump; a silicon oxide layer is formed to cover the dielectric barrier layer; and a silicon carbonitride layer is formed to cover the silicon oxide layer.

Yet another aspect of the present disclosure is to provide a chip bonding structure, wherein the chip bonding structure includes a first semiconductor chip, a second semiconductor chip and a via plug. The first semiconductor chip has a first bonding surface and includes: a metal layer, at least one metal bump, an etching stop layer, a silicon oxide layer, and a silicon carbonitride layer. The metal layer is disposed on the first bonding surface and has a metal alignment pattern. The etching stop layer covers the first bonding surface and the metal layer. The metal bump extends upward from the metal layer and penetrates through the etching stop layer. The dielectric barrier layer covers the etching stop layer and the metal bump. The silicon oxide layer covers the dielectric barrier layer. The silicon carbonitride layer covers the silicon oxide layer. The second semiconductor chip has a second metal layer and a second bonding surface facing the first bonding surface. The via plug electrically connects a first metal wire layer in the first semiconductor chip and a second metal wire layer in the second semiconductor chip.

Further aspect of the present disclosure is to provide a method for fabricating a chip bonding structure, wherein the method includes steps as follows: Firstly, a metal layer having a metal alignment pattern is formed on a first bonding surface of a first semiconductor chip. Then, an etching stop layer is formed to cover the first bonding surface and the metal layer; and a high-pressure annealing process is performed to form at least one metal bump, which extends upward from the metal layer and penetrates through the etching stop layer. Thereinafter, a dielectric barrier layer is formed to cover the etching stop layer and the metal bump; a silicon oxide layer is formed to cover the dielectric barrier layer; a silicon carbonitride layer is formed to cover the silicon oxide layer. Subsequently, a second bonding surface of a second semiconductor chip and the first bonding surface are bonded face-to-face. A via plug is formed to electrically connect a first metal wire layer in the first semiconductor chip and a second metal wire layer in the second semiconductor chip.

In accordance with the aforementioned embodiments of the present disclosure, a chip bonding alignment structure, a bonded chip structure and method for fabricating the same are provided. Firstly, a metal layer with an alignment pattern is formed on a bonding surface of one of two semiconductor chips to be bonded. A high-pressure annealing step originally used to repair a metal wire layer of the semiconductor chip is postponed and does not performed until an etching stop layer is formed on the metal layer. A plurality of metal bumps (for example, Cu hillock) are formed in the metal layer and penetrating through the etching stop layer after the high-pressure annealing is performed. Thereinafter, a dielectric barrier layer is formed on the etching stop layer to cover the metal bumps; and a bonding intermediate layer including a silicon oxide layer and a silicon carbonitride layer is then formed on the dielectric barrier layer to form the chip bonding alignment structure. Subsequently, the bonding surfaces of the two semiconductor chips are bonded face to face to form the bonded chip structure by using the chip bonding alignment structure.

Because the generation of metal bumps can increase the definition of the metal alignment pattern in the metal layer, it is beneficial to the alignment accuracy of the chip bonding process. In addition, the covering of the dielectric barrier layer can prevent the metal ions in the metal bumps from diffusing to the subsequently formed bonding intermediate layer, preventing the bonding intermediate layer from cracking, and maintaining the flatness of the bonding intermediate layer. Therefore, the alignment accuracy of the chip bonding process and be improved, the process yields and quality of the bonding chip structure can be improved.

BRIEF DESCRIPTION OF THE DRAWINGS

The above objects and advantages of the present disclosure will become more readily apparent to those ordinarily skilled in the art after reviewing the following detailed description and accompanying drawings, in which.

DETAILED DESCRIPTION

The embodiments as illustrated below provide a chip bonding alignment structure, a bonded chip structure and method for fabricating the same to improve the alignment accuracy of the chip bonding process, the manufacturing process yield and quality of the bonding chip structure. The present disclosure will now be described more specifically with reference to the following embodiments illustrating the structure and arrangements thereof.

It is to be noted that the following descriptions of preferred embodiments of this disclosure are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present disclosure. In addition, the illustrations may not be necessarily drawn to scale, and the identical elements of the embodiments are designated with the same reference numerals.

Figure 1A:
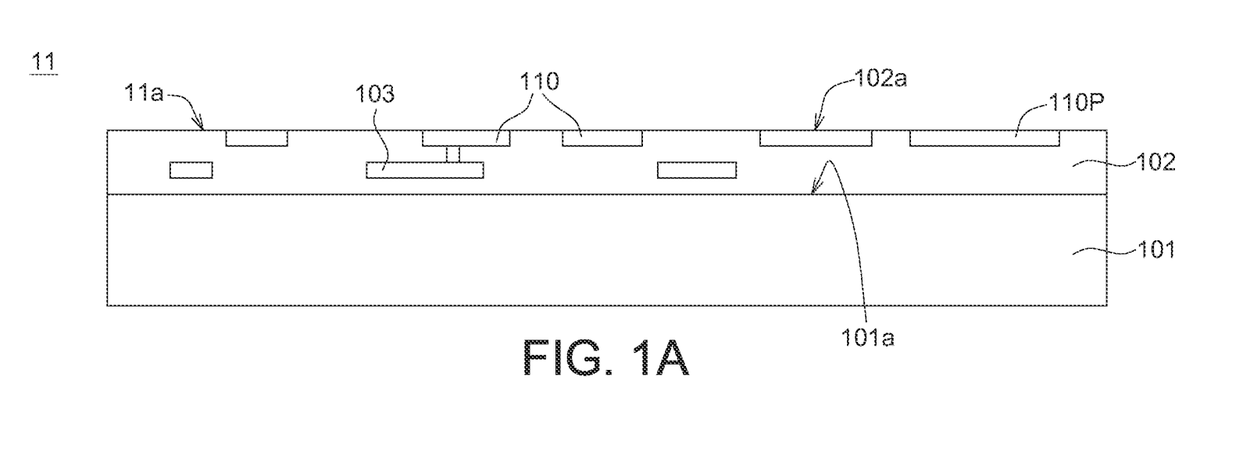
FIGS. 1A to 1F are schematic cross-sectional views illustrating a series of manufacturing structures for manufacturing the semiconductor bonding chip structure.

FIGS. 1A to 1F are schematic cross-sectional views illustrating a series of manufacturing structures for manufacturing the semiconductor bonding chip structure 10. The method for manufacturing the semiconductor bonding chip structure 10 includes steps as follows: Firstly, la first semiconductor chip 11 is provided, and a metal layer 110 having a metal alignment pattern 110P is formed on a first bonding surface 11a of the first semiconductor chip 11 (as shown in FIG. 1A).

The forming of the first semiconductor chip 11 includes steps as follows: Firstly, a back-end-of-line (BEOL) process (not shown) is performed on a front surface 101a of a device substrate 101, and an Interlayer dielectric (ILD) 102 and a metal wire layer 103 are then formed on the front surface 101a of the device substrate 101.

In some embodiments of the present disclosure, the device substrate 101 can be made of semiconductor material, such as silicon (Si), germanium (Ge), or a compound semiconductor material, such as gallium arsenide (GaAs). However, in some other embodiments, the device substrate 101 can also be a silicon on insulator (SOI) substrate. In the present embodiment, the device substrate 101 is a silicon substrate, such as a silicon wafer. The metal wire layer 103 may be a multi-layer metal wires structure including at least one semiconductor element (not shown), such as transistors, capacitors, resistors, other active/passive components, microelectronics/micromechanical structures (not shown), or the arbitrary combinations thereof.

In some embodiments of the present disclosure, the metal layer 110 may be the uppermost metal layer among the metal wire layer 103 embedded in the ILD 102. The top surface 102a of the ILD 102 may be regarded as the first bonding surface 11a of the first semiconductor chip 11. In the present embodiment, the metal layer 110 (among the multi-layer metal wires) is a patterned copper layer formed by a copper metallization process (cu-interconnection process), and the metal alignment pattern 110p may be a copper alignment pattern and is located on an edge area of the device substrate 101.

Figure 1B:
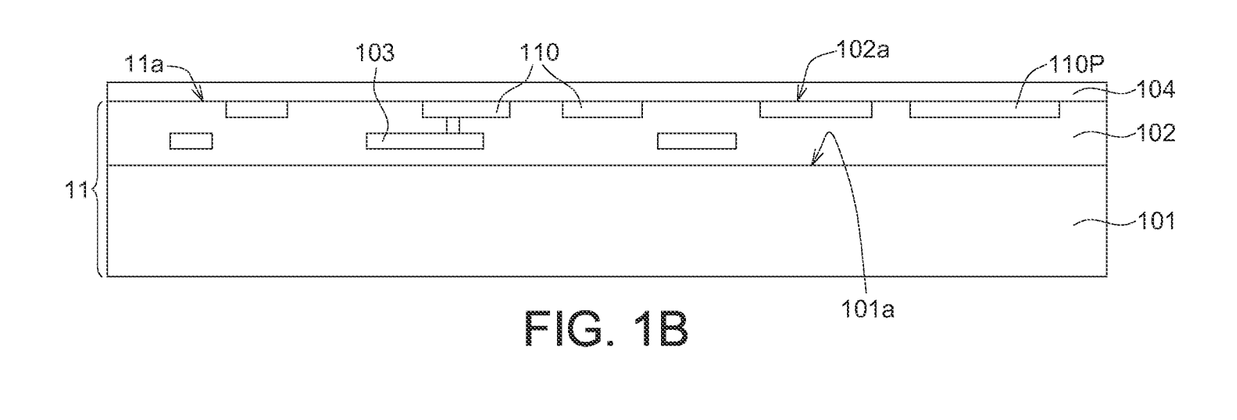

Next, as shown in FIG. 1B, an etching stop layer 104 is formed to cover the first bonding surface 11a (the top surface 102a of the ILD 102) and the metal layer 110. In some embodiments of the present disclosure, the material used to constitute the etching stop layer 104 may include a dielectric material, such as silicon carbonitride, silicon nitride and the combination thereof.

Figure 1C:
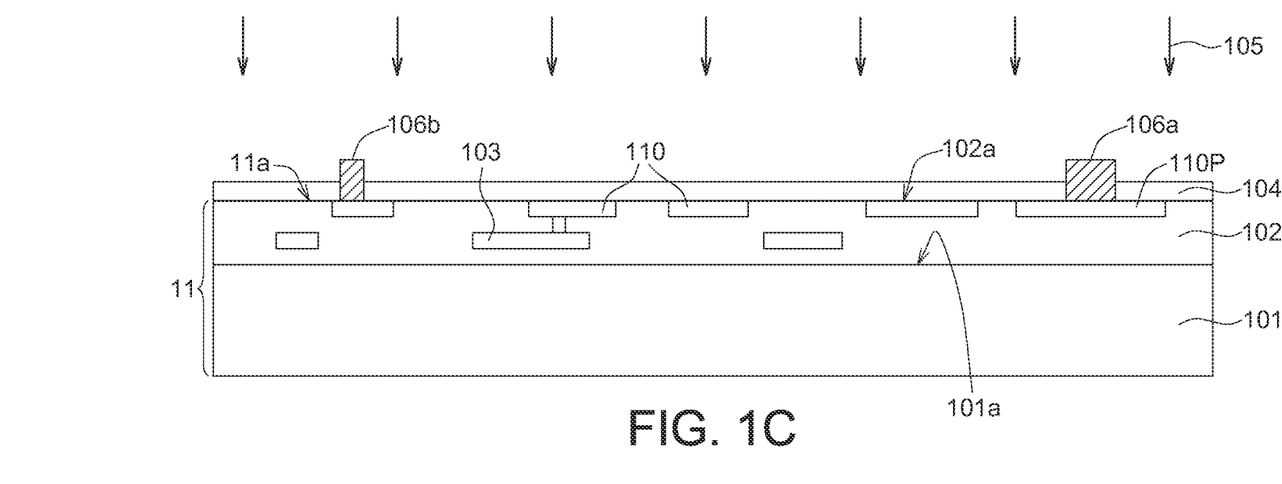

Then, a high-pressure annealing process 105 is performed to increase the surface roughness of the metal layer 110, and to form at least one metal bump (for example, metal bumps 106a and 106b) in the metal layer 110, Wherein the metal bumps 106a and 106b extend upward from the metal layer 110 and penetrate through the etching stop layer 104 (as shown in FIG. 10). In the present embodiment, since the metal layer 110 is a copper layer, thus the metal bumps 106a and 106b resulted from the high-pressure annealing process 105 may be a kind of copper hillock. The metal bump 106a may extend upward and penetrate through the etching stop layer 104 from the metal alignment pattern 110p; the metal bump 106b may extend upward and penetrate through the etching stop layer 104 from other parts of the metal layer 110.

However, it should be appreciated that the metal bumps 106a and 106b shown in FIG. 10 are only examples. In some other embodiments of the present disclosure, the number, shape, size, and location of the metal bumps may not be limited to this regard. For example, in some embodiments, after the high-pressure annealing process 105 is performed, the metal bump 106a may not be formed on the metal alignment pattern 110P. In some yet other embodiments, more metal bumps (not shown) may be formed from any other position of the metal layer 110 to extend upward and penetrate through the etching stop layer 104.

Figure 1D:
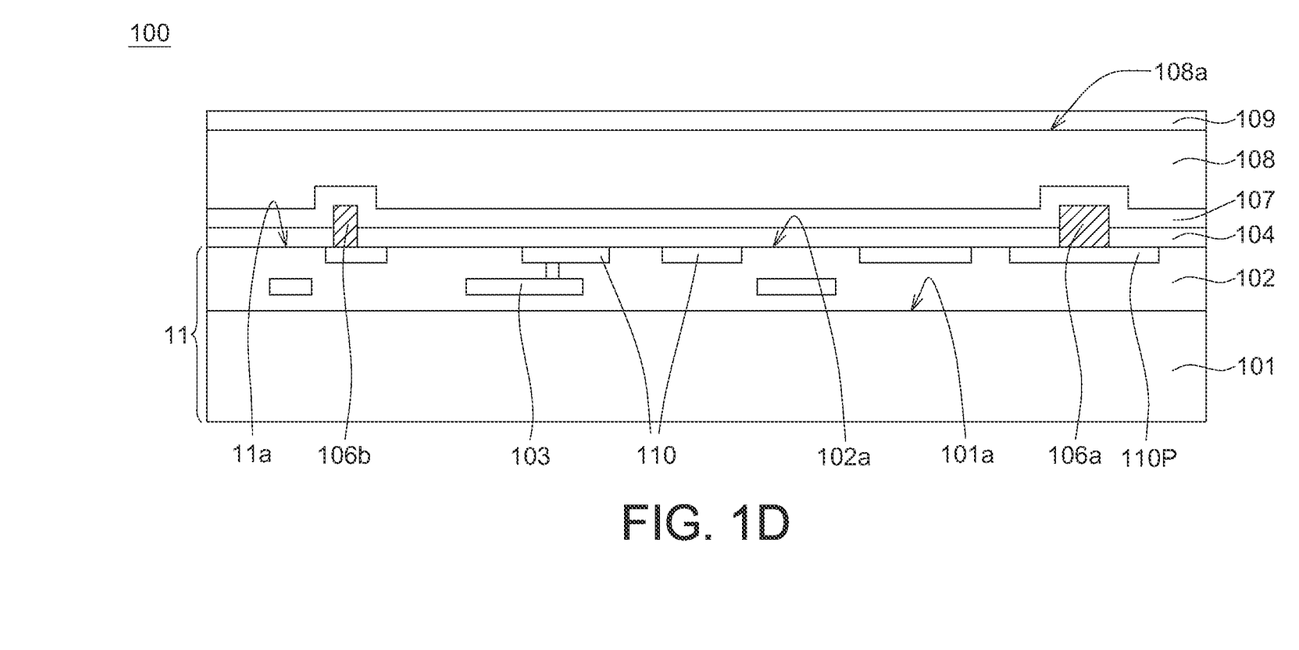

Thereinafter, several deposition manufacturing processes, such as a focused ion beam (FIB) deposition process, are performed to sequentially form a dielectric barrier layer 107 covering the etching stop layer 104 and the metal bumps 106a and 106b; a silicon oxide layer 108 covering the dielectric barrier layer 107; and a silicon carbonitride layer 109 covering the silicon oxide layer 108. Therefore, the preparation of the chip bonding alignment structure 100 as shown in FIG. 1D can be completed. Wherein, the material used to constitute the dielectric barrier layer 107 may be selected from a group consisting of silicon carbonitride, silicon carbide, silicon nitride, oxygen-containing silicon carbide, and the arbitrary combinations thereof.

In the present embodiment, before forming the silicon carbonitride layer 109, a planarization step, such as chemical-mechanical polishing (CMP) process (not shown), can be performed on the silicon oxide layer 108 for removing a portion of the silicon oxide layer 108 to provide a substantially flat upper surface 108a, and then a silicon carbonitride layer 109 can be formed on the upper surface 108a of the silicon oxide layer 108 by a deposition process.

The chip bonding alignment structure 100 may include: a semiconductor chip 11, a metal layer 110, an etching stop layer 104, at least one metal bump 106 (such as, one of the metal bump 106a and 106b), a dielectric barrier layer 107, a silicon oxide layer 108, and a silicon carbonitride layer 109. The metal layer 110 is disposed on the first bonding surface 11a of the first semiconductor chip 11 and has a metal alignment pattern 110p. The etching stop layer 104 covers the bonding surface 11a and the metal layer 107. The metal bump 106 extends upward and penetrates through the etching stop layer 104 from the metal alignment pattern 110P of the metal layer 110 or other positions. The dielectric barrier layer 107 covers the etching stop layer 104 and the metal bump 106. The silicon oxide layer 108 covers the dielectric barrier layer 107. The silicon carbonitride layer 109 covers the silicon oxide layer 108.

Figure 1E:
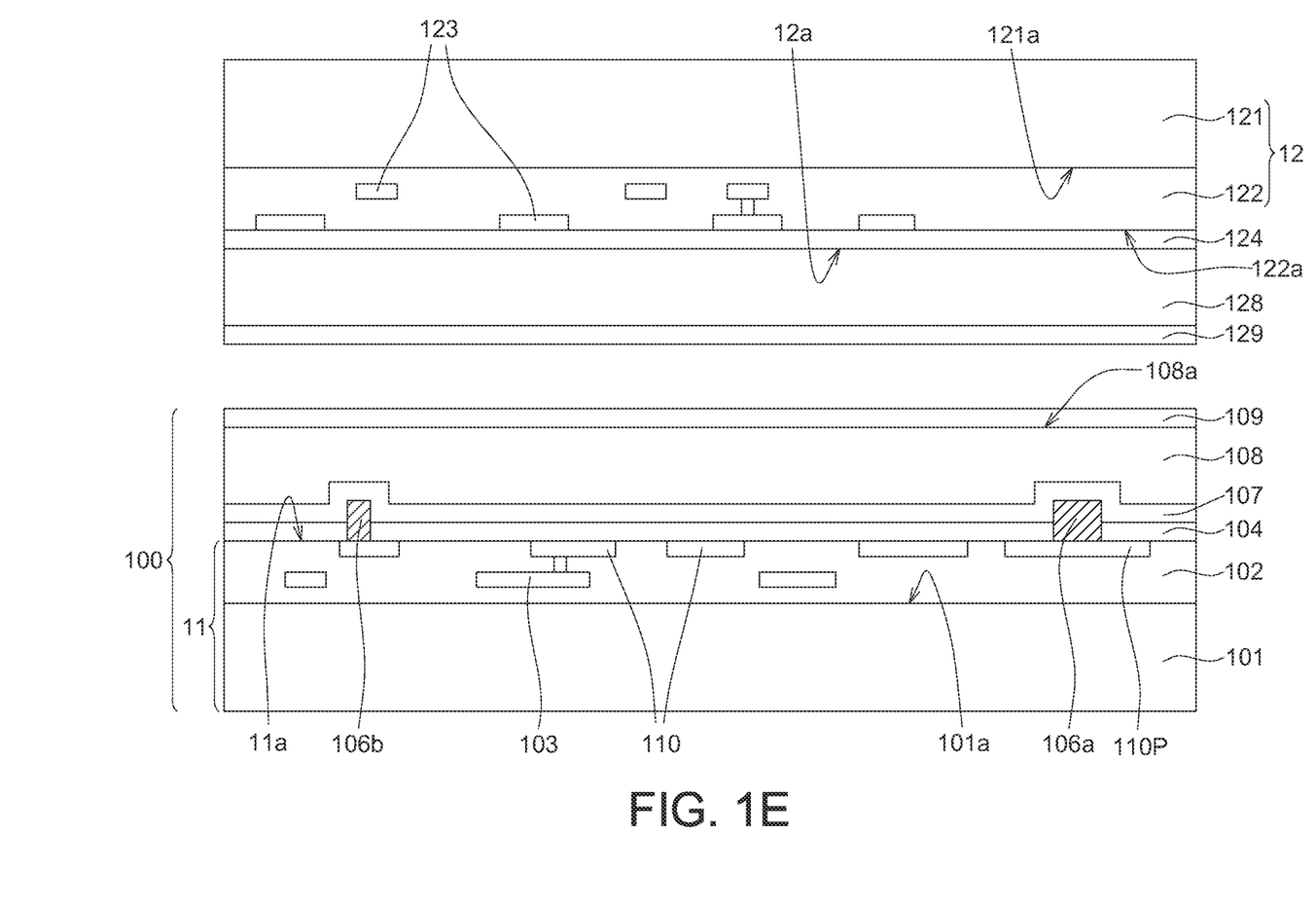

Subsequently, a second semiconductor chip 12 is provided, and the first semiconductor chip 11 and the second semiconductor chip 12 are bonded face-to-face (as shown in FIG. 1E). For example, in the present embodiment, the forming of the second semiconductor chip 12 includes steps as follows: Firstly, an ILD 122 and at least one metal wire layer 123 are formed on a front surface 121a of a device substrate 121 for forming at least one semiconductor device on the front surface 121a of the device substrate 121. Then, several deposition processes are used to sequentially form an etching stop layer 124, a silicon oxide layer 128, and a silicon carbonitride layer 129 on the ILD 122. In the present embodiment, the top surface 122a of the ILD 122 can be referred to as a bonding surface 12a of the second semiconductor chip 12.

The bonding step of the first semiconductor chip 11 and the second semiconductor chip 12 includes steps as follows: The second semiconductor chip 12 is flipped over to make the silicon carbonitride layer 129 located on the bonding surface 12a of the second semiconductor chip 12 to face-to-face contacting with the silicon carbonitride layer 109 located on the first bonding surface 11a of the semiconductor chip 11. The surface atoms of the silicon carbonitride layers 109 and 129 are then covalently bonded by heat and pressure, so as to make the first semiconductor chip 11 and the second semiconductor chip 12 are closely attached.

Figure 1F:
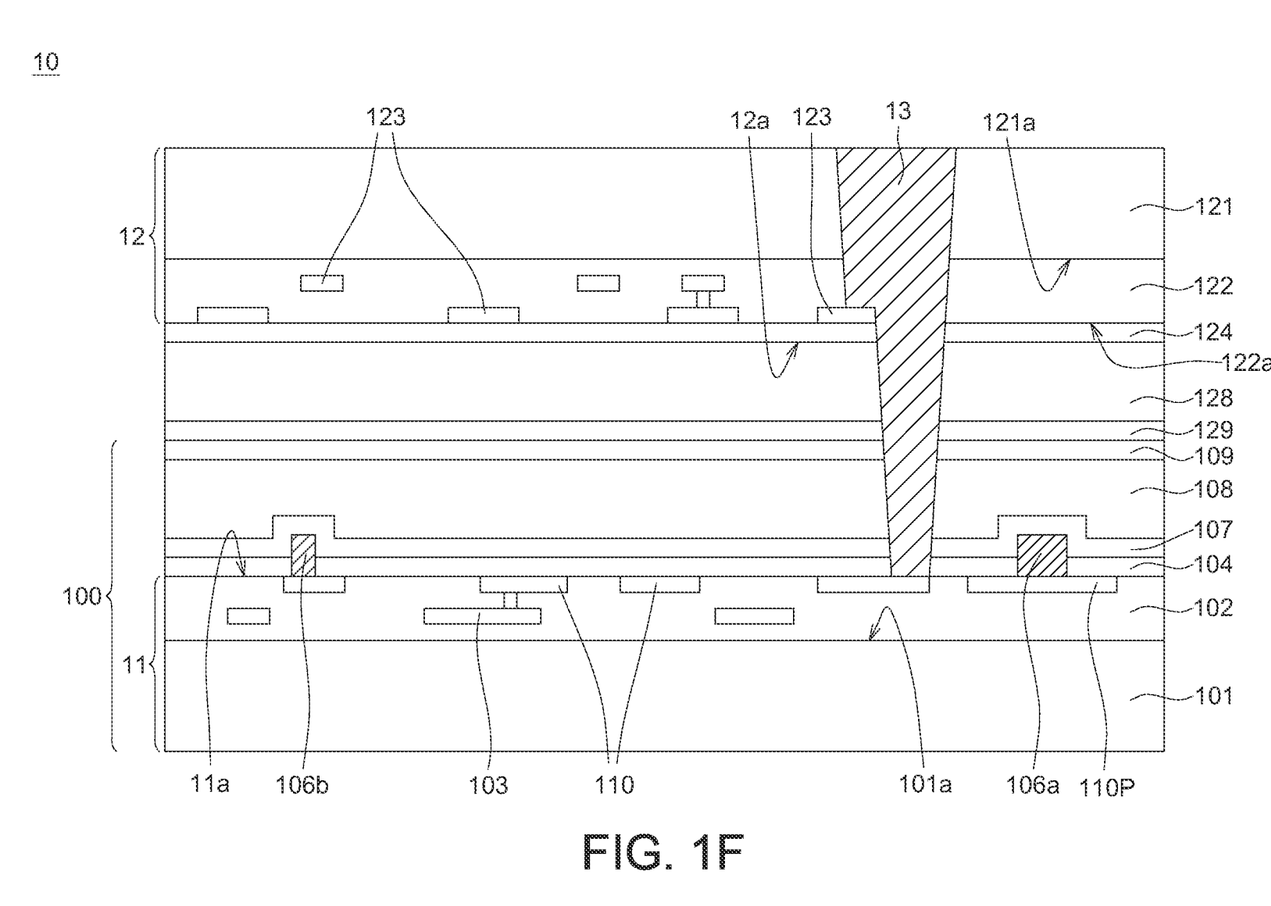

After the bonding step of the first semiconductor chip 11 and the second semiconductor chip 12, a via plug 13 is formed to connect the metal wire layer 103 in the first semiconductor chip 11 and the metal wire layer 123 in the second semiconductor chip 12. In the present embodiment, the forming of the via plug 13 includes steps as follows: An etching manufacturing process using the etching stop layer 104 as a stop layer is firstly performing to remove portions of the device substrate 121, the ILD 122, the etching stop layer 124, the silicon oxide layer 128, the silicon carbonitride layer 129, the silicon carbonitride layer 109, the silicon oxide layer 108, the dielectric barrier layer 107 and the etching stop layer 104 to form an opening to expose a part of the metal wire layer 103. The opening is then filled with conductive material. Subsequently, through a series of subsequent manufacturing processes, such as a metal damascene process (not shown), the semiconductor bonding chip structure 10 as shown in FIG. 1F can be formed.

In accordance with the aforementioned embodiments of the present disclosure, a chip bonding alignment structure 100, a bonded chip structure 10 and method for fabricating the same are provided. Firstly, a metal layer 110 with an alignment pattern 110P is formed on a bonding surface 11a of one of two semiconductor chips (one of the first semiconductor chip 11 and the second semiconductor chip 12) to be bonded. A high-pressure annealing process 105 originally used to repair a metal wire layer (the metal wire layer 103) of the semiconductor chip (the first semiconductor chip 11) is postponed and does not performed until an etching stop layer 104 is formed on the metal layer 110. A plurality of metal bumps 106 (for example, Cu hillock) are formed in the metal layer 110 and penetrating through the etching stop layer 104 after the high-pressure annealing process 105 is performed. Thereinafter, a dielectric barrier layer 107 is formed on the etching stop layer 107 to cover the metal bumps 106; and a bonding intermediate layer including a silicon oxide layer 108 and a silicon carbonitride layer 109 is then formed on the dielectric barrier layer 107 to form the chip bonding alignment structure 100. Subsequently, the bonding surfaces 11a and 12a of the two semiconductor chips (the first semiconductor chip 11 and the second semiconductor chip 12) are bonded face to face to form the bonded chip structure 10 by using the chip bonding alignment structure 100.

Because the generation of metal bumps 106 can increase the definition of the metal alignment pattern 110P in the metal layer 110, it is beneficial to the alignment accuracy of the chip bonding process 105. In addition, the covering of the dielectric barrier layer 107 can prevent the metal ions in the metal bumps 106 from diffusing to the subsequently formed bonding intermediate layer, preventing the bonding intermediate layer from cracking, and maintaining the flatness of the bonding intermediate layer. Therefore, the alignment accuracy of the chip bonding process 105 and be improved, the process yields and quality of the bonding chip structure 10 can be improved.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A chip bonding alignment structure comprising:
a semiconductor chip;
a metal layer, disposed on a bonding surface of the semiconductor chip and having a metal alignment pattern;
an etching stop layer, covering the bonding surface and the metal layer;
at least one metal bump, extending upward from the metal layer and penetrating through and directly contacting to the etching stop layer;
a dielectric barrier layer, covering the etching stop layer and totally covering a top of the at least one metal bump;
a silicon oxide layer, covering the dielectric barrier layer; and
a silicon carbonitride layer, covering the silicon oxide layer.

2. The chip bonding alignment structure according to claim 1, wherein the metal alignment pattern is a copper alignment pattern; and the at least one metal bump is a copper bump.

3. The chip bonding alignment structure according to claim 1, wherein the dielectric barrier layer comprises a dielectric material selected from a group consisting of silicon carbonitride, silicon carbide, silicon nitride, oxygen-containing silicon carbide and arbitrary combinations thereof.

4. The chip bonding alignment structure according to claim 1, wherein the etching stop layer comprises a dielectric material selected from a group consisting of silicon carbonitride, silicon nitride and a combination thereof.

5. A method for fabricating a chip bonding alignment structure comprising:
forming a metal layer having a metal alignment pattern on a bonding surface of a semiconductor chip;
forming an etching stop layer to cover the bonding surface and the metal layer;
forming at least one metal bump extending upward from the metal layer and penetrating through and directly contacting to the etching stop layer;
forming a dielectric barrier layer to cover the etching stop layer and totally cover the at least one metal bump;
forming a silicon oxide layer to cover the dielectric barrier layer; and
forming a silicon carbonitride layer to cover the silicon oxide layer.

6. The method according to claim 5, wherein forming the metal layer comprises a copper metallization process.

7. A chip bonding structure comprising:
a first semiconductor chip, having a first bonding surface, comprising:
a metal layer, disposed on the first bonding surface and having a metal alignment pattern;
an etching stop layer, covering the first bonding surface and the metal layer;
at least one metal bump, extending upward from the metal layer and penetrating through the etching stop layer;
a dielectric barrier layer, covering the etching stop layer and the at least one metal bump;
a silicon oxide layer, covering the dielectric barrier layer; and
a silicon carbonitride layer, covering the silicon oxide layer;
a second semiconductor chip, having a second bonding surface facing to the first bonding surface; and
a via plug formed to connect a first metal wire layer in the first semiconductor chip and a second metal wire layer in the second semiconductor chip.

8. The chip bonding structure according to claim 7, wherein the metal alignment pattern is a copper metal pattern, and the at least one metal bump is a copper hillock.

9. The chip bonding structure according to claim 7, wherein the metal layer is a portion of the first metal wire layer.

10. A method for fabricating a chip bonding structure, comprising:
forming a metal layer having a metal alignment pattern on a first bonding surface of a first semiconductor chip;
forming an etching stop layer to cover the first bonding surface and the metal layer;
performing a high-pressure annealing process to form at least one metal bump extending upward from the metal layer and penetrating through the etching stop layer;
forming a dielectric barrier layer to cover the etching stop layer and the at least one metal bump;
forming a silicon oxide layer to cover the dielectric barrier layer;
forming a silicon carbonitride layer to cover the silicon oxide layer;
face-to-face bonding a second bonding surface of a second semiconductor chip with the first bonding surface; and
forming a via plug to electrically connect a first metal wire layer in the first semiconductor chip and a second metal wire layer in the second semiconductor chip.

* * * * *